United States Patent
Bilbao De Mendizabal et al.

(10) Patent No.: US 10,877,123 B2
(45) Date of Patent: Dec. 29, 2020

(54) FIELD SENSOR DEVICE AND METHOD FOR REDUNDANT SENSOR ERROR REDUCTION

(71) Applicant: Melexis Technologies SA, Bevaix (CH)

(72) Inventors: Javier Bilbao De Mendizabal, Zurich (CH); Jan-Willem Burssens, Tielt-Winge (BE)

(73) Assignee: MELEXIS TECHNOLOGIES SA, Bevaix (CH)

( * ) Notice: Subject to any disclaimer, the term of this patent is extended or adjusted under 35 U.S.C. 154(b) by 18 days.

(21) Appl. No.: 16/284,283

(22) Filed: Feb. 25, 2019

(65) Prior Publication Data

US 2019/0265324 A1  Aug. 29, 2019

(30) Foreign Application Priority Data

Feb. 27, 2018   (EP) .................................. 18158795

(51) Int. Cl.
*G01R 35/00* (2006.01)
*G01R 33/02* (2006.01)
(Continued)

(52) U.S. Cl.
CPC ......... *G01R 35/00* (2013.01); *G01R 33/0023* (2013.01); *G01R 33/0029* (2013.01);
(Continued)

(58) Field of Classification Search
CPC .... G01R 33/0023; G01R 33/07; G01R 33/09; G01R 33/0029; G01R 33/0035;
(Continued)

(56) References Cited

U.S. PATENT DOCUMENTS 3,488,579 A * 1/1970 Schonstedt .......... G01R 33/022
324/245
5,629,622 A   5/1997 Scampini
(Continued)

FOREIGN PATENT DOCUMENTS

WO   2015038564 A1   3/2015
WO   2017218214 A1   12/2017

OTHER PUBLICATIONS

Extended European Search Report from EP Application No. 18158795.7, dated Sep. 8, 2018.

*Primary Examiner* — Jay Patidar
(74) *Attorney, Agent, or Firm* — Workman Nydegger

(57) ABSTRACT

A field-sensor device comprises a first field sensor with a first sensor response to a field. The first sensor response is measured in a first orientation to produce a first sensor signal, a second field sensor with a second sensor response to the field the second sensor response measured in a second orientation different from the first orientation to produce a second sensor signal, and a controller for controlling the first and second field sensors to produce respective first and second sensor signals. The controller comprises a control circuit that converts any combination of first and second sensor signals to equivalent first and second comparable sensor signals in a common orientation, calculates an error signal derived from differences between the first and second comparable sensor signals, and adjusts any combination of the first and second sensor responses to reduce the error signal.

16 Claims, 8 Drawing Sheets

(51) Int. Cl.
*G01R 33/07* (2006.01)
*G01R 33/09* (2006.01)
*G01R 33/00* (2006.01)

(52) U.S. Cl.
CPC ..... *G01R 33/0035* (2013.01); *G01R 33/0206* (2013.01); *G01R 33/07* (2013.01); *G01R 33/09* (2013.01)

(58) Field of Classification Search
CPC ................ G01R 33/0206; G01R 35/00; G01R 33/0017; G01R 35/005; G01D 18/00
See application file for complete search history.

(56) References Cited

U.S. PATENT DOCUMENTS

| | | | |
|---|---|---|---|
| 5,850,624 A * | 12/1998 | Gard | ................ E21B 47/022 702/92 |
| 7,664,619 B2 | 2/2010 | Kameya et al. | |
| 8,749,005 B1 | 6/2014 | Foletto et al. | |
| 9,523,589 B2 | 12/2016 | Nakamura et al. | |
| 9,581,426 B2 | 2/2017 | Okamoto et al. | |
| 2014/0225596 A1 | 8/2014 | Nakamura et al. | |
| 2016/0252599 A1 | 9/2016 | Motz et al. | |
| 2016/0299200 A1 | 10/2016 | Taylor et al. | |
| 2016/0377688 A1* | 12/2016 | Kleiner | ................ G05D 1/0261 324/202 |
| 2017/0356966 A1 | 12/2017 | Romero | |
| 2018/0017418 A1 | 1/2018 | Deak | |

* cited by examiner

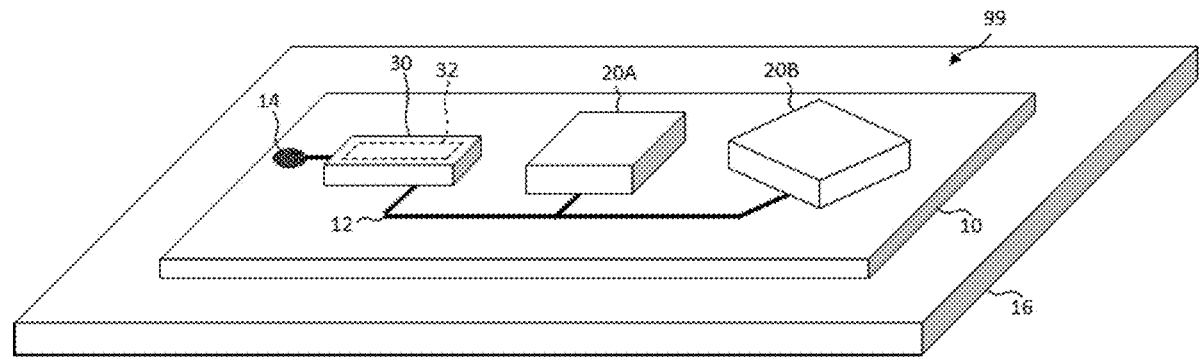
Fig.4
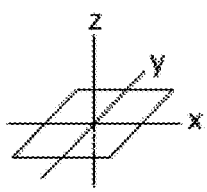 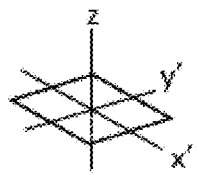 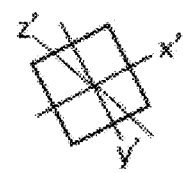
Fig.5A        Fig.5B        Fig.5C
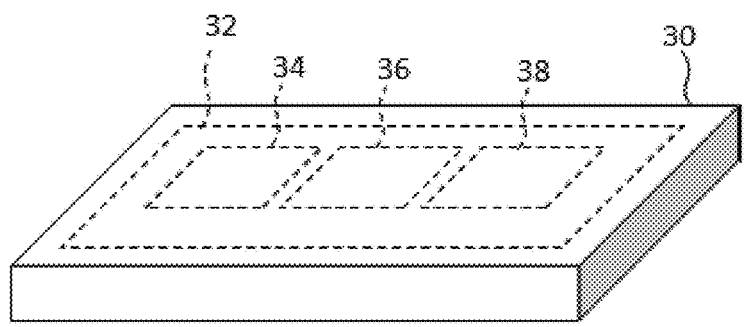
Fig.6

Example A

| Time 1 | | Time 2 | |
|---|---|---|---|
| $M_{A1}=$ | 4,4 | $M_{A2}=$ | 2,2 |
| $M_{B1}=$ | 6,6 | $M_{B2}=$ | 3,3 |
| $P_1=$ | 2,2 | $P_2=$ | 1,1 |

$Cx=m_x x+b_x$ :  $m_x=1.5, b_x=0$
$Cy=m_y y+b_y$ :  $m_y=1.5, b_y=0$

Example B

| Time 1 | | Time 2 | |
|---|---|---|---|
| $M_{A1}=$ | 4,4 | $M_{A2}=$ | 2,2 |
| $M_{B1}=$ | 6,8 | $M_{B2}=$ | 3,4 |
| $P_1=$ | 2,4 | $P_2=$ | 1,2 |

$Cx=m_x x+b_x$ :  $m_x=1.5, b_x=0$
$Cy=m_y y+b_y$ :  $m_y=2.0, b_y=0$

Example C

| Time 1 | | Time 2 | |
|---|---|---|---|
| $M_{A1}=$ | 4,4 | $M_{A2}=$ | 2,2 |
| $M_{B1}=$ | 7,10 | $M_{B2}=$ | 4,5 |
| $P_1=$ | 3,6 | $P_2=$ | 2,3 |

$Cx_S=m_x(x+b_x)$: $m_x=2/3, b_x=-1$
$Cy_S=m_y(y+b_y)$: $m_y=1/2, b_y=-2$

FIELD SENSOR DEVICE AND METHOD FOR REDUNDANT SENSOR ERROR REDUCTION

FIELD OF THE INVENTION

The present invention is generally related to the field of field sensor error reduction structures, circuits and methods.

BACKGROUND OF THE INVENTION

Sensors are widely used in electronic devices to measure attributes of the environment and report a measured sensor value. In particular, magnetic sensors are used to measure magnetic fields, for example in transportation systems such as automobiles. Magnetic sensors can incorporate Hall-effect sensors that generate an output voltage proportional to an applied magnetic field or magneto-resistive materials whose electrical resistance changes in response to an external magnetic field. In many applications it is desirable that sensors are small and integrated with electronic processing circuitry so as to reduce the overall sensor size and provide improved measurements and integration into external electronic systems. For example, US2016/299200 describes a Hall-effect magnetic sensor for measuring magnetic fields incorporating an integrated circuit formed in a semiconductor material on a substrate, together with insulation and adhesive layers.

Sensors are often calibrated to ensure that the measurements they provide are accurate. US2017/356966 ('*Magnetic Field Sensor having Alignment Correction*') describes a magnetic field sensor and method for detecting non-orthogonality between two sensor elements in a magnetic field sensor. By measuring the response of two magnetic sensor elements in a field sensor to a rotating magnetic field, the relative angle between the two sensor elements can be determined and compensated.

Measurements from sensors can drift over time, providing varying measurements even when exposed to the same field. For example, field measurements can be offset from a desired nominal value, the sensitivity can vary so that measurements are a multiple (either greater or less than one) of the desired value, or both. Such variation can be the result of changes in environmental conditions, for example temperature or humidity or operational factors, such as vibration or aging. Moreover, devices can fail over time for similar reasons. Furthermore, the materials from which sensors are made can have defects that affect the accuracy, offset bias or symmetry of the sensor's response.

It is important, therefore, to include diagnostic capabilities to detect faults or failures in complex, safety-critical systems, such as automotive systems, so that repairs can be performed or replacements can be provided for any faulty or failed sensor devices. It is also important to reduce the effects of sensor drift or other sensor changes so that sensors provide a more consistent and accurate measurement over time. For example, WO2015/038564 describes a method for verifying measurements from a magnetic Hall-effect sensor in a Hall-effect sensor system. In this approach, the Hall-effect sensor is excited with an excitation current having a first value. A first measurement corresponding to a voltage output of the Hall-effect sensor when the Hall-effect sensor is excited with the excitation current having the first value is obtained. Additionally, the Hall-effect sensor is excited with the excitation current having a second value, the second value different from the first value. A second measurement corresponding to a voltage output of the Hall-effect sensor when the Hall-effect sensor is excited with the excitation current having the second value is obtained. Operation of the Hall-effect sensor is then verified based at least on the first measurement and the second measurement.

Another approach to managing diagnostics in a magnetic field sensor is described in US2016/252599. This design uses switches associated with a magnetic field sensor that provide error information. In particular, a device is provided that includes a magnetic field sensor, a plurality of switches associated with the magnetic field sensor and a control circuit configured to control the plurality of switches and to provide at least one signal indicative of a fault based on operation of the switches.

U.S. Pat. No. 9,523,589 describes a rotation angle measurement apparatus having four Hall element pairs for detecting magnetic field components in four different directions and used to calculate the position of a rotating magnet. The angles of the detected field components are compared to determine faults. In this design the amplitude calculation unit calculates a first amplitude value M representing the magnetic field strength from the rotating magnet based upon the strengths of the output signals from the first Hall element pair and the second Hall element pair, and calculates a second amplitude value Mc representing the magnetic field strength from the rotating magnet based upon the strengths of the output signals from the third Hall element pair and the fourth Hall element pair. Thus, the amplitude calculation unit calculates plural pieces of the amplitude information based upon the output signals from the plural pairs of Hall elements (i.e., magnetic sensors), the output signals correspond to the plural pieces of rotation angle information and the fault is determined by a comparison of the plural pieces of rotation angle information and, in some versions with the strength of the rotating element field.

U.S. Pat. No. 8,749,005 describes a magnetic field sensor with a plurality of polygonally arranged vertical Hall elements. U.S. Pat. No. 9,581,426 discloses a magnetic field measuring device having four magneto-electric transducers on a magneto-sensing surface. U.S. Pat. No. 7,664,619 describes a fault detection unit for a rotation angle detecting device by comparing the measured values to normal ranges and otherwise determines faults.

Since field sensors are subject to operating or structural faults, defects or changes in the sensor materials or devices that lead to incorrect or variable field measurements, there is a need for circuits and methods in reliable sensor devices and systems that operate and test the sensor devices and systems to detect or correct faults or errors in the sensor under critical operating conditions.

SUMMARY OF THE INVENTION

It is an object of embodiments of the present invention to provide for a field-sensor device capable of detecting errors in a sensor.

The above objective is accomplished by the solution according to the present invention.

Embodiments of the present invention provide a field-sensor device comprising a first field sensor disposed in a first orientation, the first field sensor responsive to an external field to produce a first sensor signal, a second field sensor disposed in a second orientation different from the first orientation, the second field sensor responsive to the external field to produce a second sensor signal. The first field sensor can have a first response to the field, measured in a direction corresponding to the first orientation to produce the first sensor signal. Similarly, the second field sensor can have a second response to the field, measured in a direction corresponding to the second orientation to produce the second sensor signal.

A controller comprises a control circuit that controls the first and second field sensors to produce corresponding and respective first and second sensor signals, receives the first and second sensor signals and converts the first or second sensor signal, or both, to equivalent comparable sensor signals in a common orientation. An orientation can be or correspond to a coordinate system and can correspond to a direction.

In an embodiment the controller compares the comparable sensor signals to determine a faulty field sensor, if any, and, if a faulty field sensor is determined, optionally provides a faulty sensor signal and determines which of the first and second field sensors is faulty or, if a faulty sensor is not determined, provides an output sensor signal responsive to the first, second or comparable sensor signals. In another embodiment the controller calculates an error signal derived from differences between the first and second comparable sensor signals and adjusts any combination of the first and second sensor responses to reduce the error signal.

According to embodiments of the present invention, a field is an environmental attribute or characteristic that has a magnitude and a direction, for example a vector field. In various embodiments the field can be a magnetic field, a pressure field, an electric field or a gravitational field and the field sensor can be a magnetic field sensor, a pressure field sensor, an electric field sensor or a gravitational field sensor.

In some embodiments of the present invention the first orientation differs from the second orientation in two orthogonal dimensions. In other embodiments of the present invention the first orientation differs from the second orientation in three orthogonal dimensions. The first and second orientations can be corresponding first and second coordinate systems, directions or dimensions. An orientation of a field sensor is determined by the axes of measurement provided by the field sensor. If a first field sensor has a measurement axis that is not co-linear with the measurement axis of a second field sensor, the first and second field sensors have different orientations in at least the dimension defined by the measurement axis.

In some configurations the control circuit includes a storage circuit for storing any one or more of the first sensor signal, the second sensor signal, the first comparable sensor signal, the second comparable sensor signal, any corrected or adjusted signals, the error signal, error function, the correction or a rotation matrix. In some configurations the controller or control circuit includes a conversion circuit (e.g., a computer with a stored software program, a processing unit, a calculator or a state machine) for converting either or both of the first sensor signal and the second sensor signal to a different orientation or coordinate system. In some configurations the controller or control circuit includes a comparison circuit for comparing any one or more of the first sensor signal, the second sensor signal and any comparable sensor signal. In various embodiments the controller can comprise multiple integrated circuits disposed on different substrates or printed circuit boards or can be disposed in a single integrated circuit. The controller can comprise multiple control circuits for providing different control, calculation or communication functions, for example processing units, dedicated control circuits, analog circuits, digital circuits, programmable circuits or state machines in one or more packages or structures, or implemented on one or several printed circuit boards.

In some embodiments the first or second field sensor is an angular field sensor that comprises one or more sensor elements, pairs of sensor elements, or is a bridge sensor having multiple sensor elements that can measure the angle of a field vector with respect to a coordinate system. Each sensor element or pair of sensor elements can measure a field vector in a particular direction and the sensor elements or pairs of sensor elements in a common angular field sensor can be arranged substantially orthogonally within manufacturing tolerances to measure the field in different directions, thus providing an angular measurement with respect to the coordinate system. For example, a first angular field sensor can measure a field having a direction and magnitude and provide an angular sensor measurement having two components, for example $Bx$, $By$ according to a first coordinate system. A second angular field sensor can measure the same field and provide an angular sensor measurement having two components, for example $Bx'$, $By'$ according to a second coordinate system different from the first coordinate system. The two measurements, taken in different coordinate systems, can be compared by converting them to a common, comparable coordinate system, for example by converting the $Bx'$ and $By'$ measurements to the first coordinate system, by converting the $Bx$ and $By$ measurements to the second coordinate system, or by converting both the $Bx$ and $By$ measurements and the $Bx'$ and $By'$ measurements to a third, common coordinate system.

In some configurations the first and second field sensors are disposed on a device substrate comprising a substrate material and the first or second field sensors comprise one or more sensor materials at least partially different from the substrate material. The substrate material can be a semiconductor and the control circuit can be at least partially formed in or on the semiconductor substrate. The control circuit can comprise a control-circuit material that is at least partially different from the substrate material and the control circuit can be disposed on the substrate.

A method of diagnosing a field-sensor device according to an embodiment of the present invention comprises providing a field-sensor device, providing electrical power to the field-sensor device, using the control circuit to control the first and second field sensors to produce respective first and second sensor signals, using the control circuit to receive the first and second sensor signals, using the control circuit to convert the first or second sensor signal or both, to equivalent comparable sensor signals in a common orientation, and using the control circuit to compare the comparable sensor signals and determine if the first or second field sensor is faulty, and if a faulty field sensor is determined, using the control circuit to provide a faulty sensor signal responsive to the comparable sensor signals and, optionally, to determine which of the first and second field sensors is faulty, or if a faulty field sensor is not determined, using the control circuit to provide an output sensor signal responsive to the first, second or comparable sensor signals. If the second field sensor is faulty, an output sensor signal that is the first sensor signal or is derived from the first sensor signal can be provided. If the first field sensor is faulty, an output sensor signal that is the second sensor signal or is derived from the second sensor signal can be provided. Thus, field-sensor devices of the present invention can continue to operate even when one of the field sensors has failed by identifying the failed field sensor and using sensor signals from a remaining other field sensor.

In some embodiments the first field sensor or the second field sensor comprises two or more sensor elements and, if one of the first or second field sensors is faulty, which of the two or more sensor elements is faulty is determined by comparing and categorizing the different measurements of the first and second field sensors, where the first field sensor measures the field in x and y dimensions and the second field sensor measure the field in x' and y' dimensions different from the x, y dimensions. If the measurements are converted to the first coordinate system and the difference is in the x direction then the x-sensor element of the first field sensor is faulty. If the difference is in the y direction then the y-sensor element of the first field sensor is faulty. If the difference is in the x' direction then the x'-sensor element of the second field sensor is faulty. If the difference is in the y' direction then the y'-sensor element of the second field sensor is faulty. A difference can be determined when it exceeds a pre-determined magnitude threshold, tolerance, or margin so that small differences, for example due to manufacturing variability, are not necessary considered to be faults.

In other embodiments of the present invention a correction or adjustment to the measured sensor values is computed from differences between the first and second comparable signals that form an error signal. In various embodiments the differences can be differences in magnitude, differences in direction, differences in both magnitude and direction, or a vector difference. The step of calculating the error signal can comprise calculating the differences between the first and second comparable sensor signals as an error function of any other combination of the first and second comparable sensor signals, any combination of components or constituents of the first and second comparable sensor signals, or, when the first and second field sensors comprise two or more sensor elements producing sensor element signals, any combination of sensor element signals. A correction corresponding to the error function is determined and used to adjust any combination of the first and second sensor responses to reduce the error signal and adjust any measurement signal or output sensor signal.

The correction function can be a constant or a linear function having a slope and an offset. In an embodiment the step of adjusting any combination of the first and second sensor responses can comprise multiplying the constant times any combination of the first and second sensor signals or adding the constant to any combination of the first and second sensor signals. In other embodiments the step of adjusting any combination of the first and second sensor responses can comprise multiplying a value derived from the slope to any combination of the first and second sensor responses to produce any combination of the first and second sensor responses, adding a value derived from the offset to any combination of the first and second sensor responses to produce any combination of the first and second sensor responses, both, or adding a value derived from the offset to any combination of the first and second sensor responses produced by multiplying a value derived from the slope to any combination of the first and second sensor responses, that is, a product of a value derived from the slope and any combination of the first and second sensor responses.

In other embodiments a third field sensor with a third sensor response to the field is provided, the third sensor response measured in a third orientation to produce a third sensor signal. Another control circuit can be disposed in the controller for controlling the third field sensor to produce third sensor signals. The controller can be used to convert third sensor signals to equivalent third comparable sensor signals in the common orientation if the third orientation is different from the common orientation else the third sensor signals are third comparable sensor signals, and calculate an error signal derived from differences between the third comparable sensor signals and any combination of the first and second comparable sensor signals. Any combination of the first, second and third sensor responses can be adjusted to reduce the error signal.

In general, two or more (e.g., three or four) field sensors can be provided in at least two different orientations. The various field sensors are provided in or converted to a common orientation to provide comparable signals, differences between the comparable signals calculated and error functions determined, and a correction and adjustments derived from the error function to reduce errors in the output sensor signal. Differences between various combinations of comparable signals can provide various error functions. The error functions can be combined into a multi-dimensional error function that is analyzed to determine a correction for each of the field sensors.

In methods of the present invention calculating the error signal comprises calculating the differences between the third comparable sensor signals and any combination of the first and second comparable sensor signals as an error function of any other combination of the first, second and third comparable sensor signals, any combination of components or constituents of the first, second or third comparable sensor signals, or, when the first, second and third field sensors comprise two or more sensor elements producing sensor element signals, any combination of sensor element signals. A correction to the error function is determined. The correction can be a constant or a linear function having a slope and an offset.

In some embodiments the step of adjusting any combination of the first, second and third sensor responses can comprise multiplying the constant times any combination of the first, second and third sensor signals or adding the constant to any combination of the first, second and third sensor signals. In other embodiments the step of adjusting any combination of the first, second and third sensor responses can comprise multiplying a value derived from the slope to any combination of the first, second and third sensor responses to produce any combination of the first and second sensor responses, adding a value derived from the offset to any combination of the first, second and third sensor responses to produce any combination of the first and second sensor responses, both, or adding a value derived from the offset to any combination of the first, second and third sensor responses produced by multiplying a value derived from the slope to any combination of the first and second sensor responses, that is adding a value derived from the offset to a product of a value derived from the slope and any combination of the first, second and third sensor responses.

In various embodiments the third orientation is different from the first orientation and different from the second orientation, the third orientation is the same as the first orientation, or the third orientation is the same as the second orientation. The first and second orientations can be in a common plane and the first orientation can be 45 degrees rotated from the second orientation, the first orientation can be non-orthogonal to the second orientation, or the first and second orientations can be both non-orthogonal to the second orientation and 45 degrees rotated from the second orientation.

In other methods of the present invention an output sensor signal responsive to any combination of the first and second sensor signals and any adjusted responses is provided.

According to embodiments of the present invention, a field-sensor device comprises a first field sensor with a first sensor response to a field, the first sensor response measured in a first orientation to produce a first sensor signal, a second field sensor with a second sensor response to the field, the second sensor response measured in a second orientation different from the first orientation to produce a second sensor signal, and a controller for controlling the first and second field sensors to produce respective first and second sensor signals. The controller can comprise a control circuit that converts any combination of first and second sensor signals to equivalent first and second comparable sensor signals in a common orientation, and calculates an error signal derived from differences between the first and second comparable sensor signals and adjusts any combination of the first and second sensor responses to reduce the error signal.

In embodiments of the present invention the controller can comprise a control circuit that calculates the differences between the first and second comparable sensor signals as an error function of any other combination of the first and second comparable sensor signals, any combination of components or constituents of the first and second comparable sensor signals (e.g., magnitude in a coordinate system direction, absolute magnitude, direction), or, when the first and second field sensors comprise two or more sensor elements producing sensor element signals, any combination of sensor element signals, such as a voltage indicating a sensor element signal magnitude. The control circuit can determine a correction corresponding to the error function. The correction function can be a constant or a linear function having a slope and an offset. The correction can be used to adjust the first and second sensor responses to form a more accurate corrected or adjusted output sensor signal with reduced error.

In embodiments of the present invention the controller can comprise a control circuit that adjusts any combination of the first and second sensor responses by multiplying the constant times any combination of the first and second sensor signals or by adding the constant to any combination of the first and second sensor signals. In other embodiments the controller can comprise a control circuit that adjusts any combination of the first and second sensor responses by multiplying a value derived from the slope to any combination of the first and second sensor responses, adds a value derived from the slope to any combination of the first and second sensor responses, both, or adds a value derived from the offset to a product of a value derived from the slope and any combination of the first and second sensor responses.

In other embodiments of the present invention the field-sensor device comprises a third field sensor with a third sensor response to the field, the third sensor response measured in a third orientation to produce a third sensor signal and another control circuit disposed in the controller for controlling the third field sensor to produce the third sensor signal. The controller can convert third sensor signals to equivalent third comparable sensor signals in the common orientation if the third orientation is different from the common orientation else the third sensor signals are third comparable sensor signals, calculate an error signal derived from differences between the third comparable sensor signals and any combination of the first and second comparable sensor signals, and adjust any combination of the first, second, and third sensor responses to reduce the error signal. The controller can comprise a control circuit that calculates the differences between the third comparable sensor signals and any combination of the first and second comparable sensor signals as an error function of any other combination of the first, second and third comparable sensor signals, any combination of components or constituents of the first, second, or third comparable sensor signals, or, when the first, second and third field sensors comprise two or more sensor elements producing sensor element signals, any combination of sensor element signals. The control circuit can determine a correction corresponding to the error function. The correction can be a constant or a linear function having a slope and an offset.

In embodiments of the present invention the controller comprises a control circuit that adjusts any combination of the first second and third sensor responses by multiplying the constant times any combination of the first, second and third sensor signals or adding the constant to any combination of the first, second and third sensor signals. In other embodiments the controller can comprise a control circuit that adjusts any combination of the first second and third sensor responses by multiplying a value derived from the slope to any combination of the first, second and third responses, adding a value derived from the slope to any combination of the first, second and third responses, both, or adding a value derived from the offset to any combination of the first and second sensor responses produced by multiplying a value derived from the slope to any combination of the first, second and third responses, that is adding a value derived from the offset to a product of a value derived from the slope and any combination of the first, second and third sensor responses.

In various embodiments of the field-sensor device the third orientation is different from the first orientation and different from the second orientation, the third orientation is the same as the first orientation, or the third orientation is the same as the second orientation.

In some embodiments the steps are repeated at a first time and the first, second or any comparable sensor signals are stored. The steps are repeated at a second time different from the first time, and any one or more of the stored signals and any one of the first, second or comparable sensor signals of the second time are compared, processed or combined. In other embodiments the comparable sensor signals or signals derived from the first and second sensor signals are combined to provide the output sensor signal. In various embodiments of the present invention the sensor is a magnetic Hall-effect sensor or a magneto-resistive sensor. The sensor can be a bridge sensor, can incorporate a plurality of sensor elements or can incorporate one or more pairs of sensor elements. Pairs of sensor elements can be oriented in different directions or dimensions within a field sensor.

Embodiments of the present invention provide sensor devices having improved sensing capability and measurements with reduced errors using smaller and less expensive circuits and can correct or reduce errors in the sensor devices or compensate for, or detect faults or fine defects in, the sensor or sensor material. Measurement errors can include, but are not limited to, sensor drift or sensor response variation. Faults can include, but are not limited to, disconnection, high-resistance connections, short circuits or material faults. The detection can occur at the same time that the sensor circuit is operating.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The foregoing and other objects, aspects, features, and advantages of the present disclosure will become more apparent and better understood by referring to the following description taken in conjunction with the accompanying drawings.

FIG. 4 is a perspective of alternative illustrative embodiments of the present invention.

FIG. 5A illustrates a first coordinate system according to embodiments of the present invention. FIG. 5B illustrates a second coordinate system according to embodiments of the present invention. FIG. 5C illustrates a third coordinate system according to embodiments of the present invention.

FIG. 6 is an illustrative perspective of a controller according to illustrative embodiments of the present invention.

DETAILED DESCRIPTION OF ILLUSTRATIVE EMBODIMENTS

Figure 1:
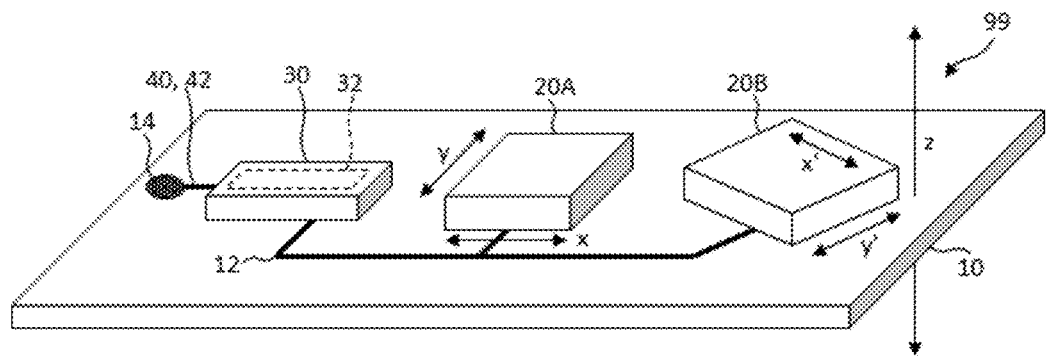
FIG. 1 is a perspective of illustrative embodiments of the present invention.

The present invention will be described with respect to particular embodiments and with reference to certain drawings but the invention is not limited thereto but only by the claims. The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

Embodiments of the present invention provide sensor devices having improved diagnostic, correction and error reduction capability and more accuracy using smaller and less expensive circuits and can compensate for, detect or diagnose faults or fine defects in the sensor material or damage to the sensor or correct or reduce measurement errors while the sensor device is operating. Such defects can be inherent in the material used to make the sensor or can be formed over time, as a result of use, or in response to mechanical or other environmental stresses on the sensor. Moreover, measurements from sensors can drift over time, providing varying measurements even when exposed to the same field. For example, field measurements can be offset from a desired nominal value, the sensitivity can vary so that measurements are a multiple (either greater or less than one) of the desired value, or both. Such variation can be the result of changes in environmental conditions, for example temperature or humidity, or operational factors, such as vibration or aging. Embodiments of the present invention can correct or reduce errors in sensor measurements, providing more consistent and accurate measurement results.

In various embodiments of the present invention sensors can detect fields having vectors comprising a direction and magnitude, for example magnetic fields, electrical fields, pressure fields or gravitational fields.

Figure 2:
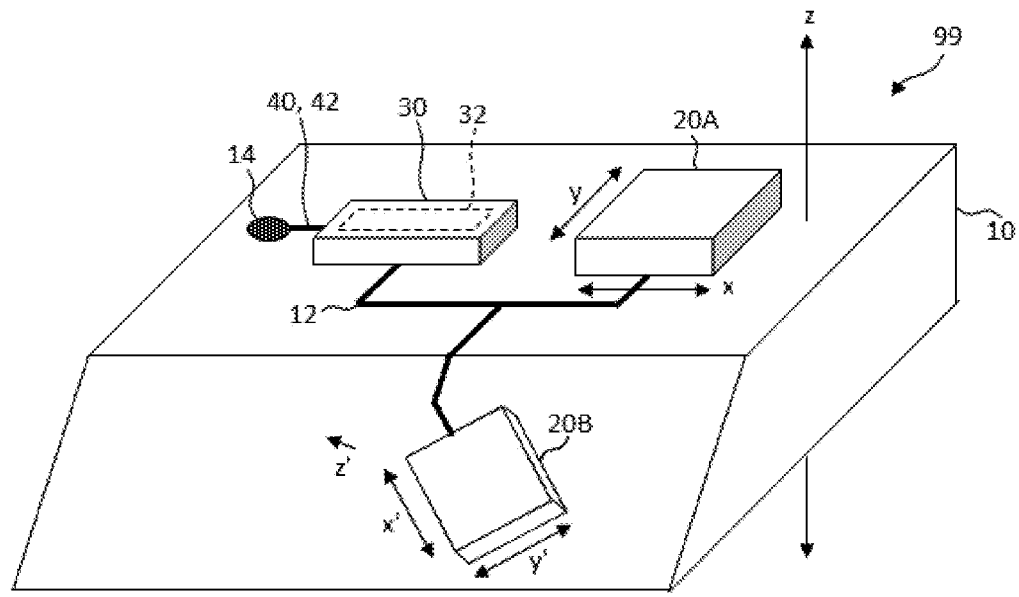
FIG. 2 is a perspective of other illustrative embodiments of the present invention.

Referring to FIGS. 1 and 2, in embodiments of the present invention a field-sensor device 99 comprises a first field sensor 20A disposed in a first orientation responsive to an external field to produce a first sensor signal and a second field sensor 20B disposed in a second orientation different from the first orientation responsive to the external field to produce a second sensor signal. The first and second field sensors 20A, 20B (and any other field sensors) are referred to collectively as field sensors 20. A controller 30 comprises a control circuit 32 that controls the first and second field sensors 20A, 20B to produce corresponding first and second sensor signals, receives the first and second sensor signals, and converts the first or second sensor signal, or both, to equivalent comparable sensor signals in a common orientation or coordinate system.

In one embodiment of the present invention the control circuit 32 of the controller 30 compares the comparable sensor signals to determine whether the first or second field sensor 20A, 20B is faulty, and, if a faulty field sensor 20 is determined, provides a faulty sensor signal 42 and optionally determines which of the first and second field sensors 20A, 20B is faulty. If a faulty field sensor 20 is not determined, the controller 30 provides an output sensor signal 40 responsive to the first, second, or comparable sensor signals indicating attributes of the sensed field, such as magnitude and direction. In various embodiments the field is a magnetic field, an electrical field, a pressure field or a gravitational field and the sensors 20 are magnetic field sensors, electrical field sensors, pressure field sensors or gravitational field sensors. The first and second orientations can also be described as corresponding first and second coordinate systems, directions or dimensions, for example each having x, y, or z orthogonal dimensions. In other embodiments of the present invention more than two or more than three field sensors 20 comprise the field-sensor device 99.

In another embodiment of the present invention the control circuit 32 of the controller 30 converts any combination of first and second sensor signals to equivalent first and second comparable sensor signals in a common orientation or coordinate system, and calculates an error signal derived from differences between the first and second comparable sensor signals. Any combination of the first and second sensor responses are adjusted to reduce the error signal and provide a corrected output signals with reduced errors. Moreover, a corrected output signal can be provided even if one of the field sensors 20 is determined to be faulty, for example by using corrected or adjusted measurements from the field sensors 20 that are operating normally. If three or more field sensors 20 comprise the field-sensor device 99 of the present invention, the faulty field sensor 20 can be excluded from the difference calculations and error function used to derive the correction and adjustments.

Conventionally, comparisons between the measurements of a common field by multiple sensors can indicate a fault or error in one of the sensors when the measurements differ. However, according to embodiments of the present invention the first and second field sensors 20A, 20B have different orientations so that at least some of their measurement axes are not co-linear and the field sensors 20 therefore provide redundant field measurements in different coordinate systems. Thus, a comparison of the redundant field measurements in a common coordinate system can not only indicate errors or faults in the first or second field sensors 20A, 20B, but indicate which field sensor 20 is at fault, providing an additional test and check of the field sensors 20.

By identifying the failed field sensor 20, the field-sensor device 99 can continue to operate by using the sensed signals from other field sensors 20, in contrast to sensor systems that can detect a failure, but cannot continue to operate because the failure cannot be identified or associated with a specific field sensor 20. In further embodiments comprising more than two field sensors 20, more than two sensor signals can be converted to a common orientation and more than two comparable signals can be compared to determine faulty field sensors 20, to correct the field sensor 20 signal or adjust the field sensor responses and provide a corrected output sensor signal, or to reduce errors in the measurements provided by the more than two field sensors 20.

The first field sensor 20A, the second field sensor 20B and the controller 30 can be disposed on a device substrate 10 and electrically connected with electrical conductors such as wires 12, and can include single wires 12 or buses comprising multiple wires 12 that can communicate power, ground and control signals to or from the field-sensor device 99, the controller 30, the first field sensor 20A or the second field sensor 20B, for example through electrical contact pads 14 disposed on the device substrate 10. The field sensors 20 can be Hall-effect field sensors or magneto-resistive sensors and can comprise a compound semiconductor material. Alternatively, the field sensors 20 are electric field sensors, pressure field sensors or gravitational field sensors and can, for example, incorporate micro-electro-mechanical systems (MEMS) devices.

The first and second field sensors 20A, 20B can be disposed in a common plane or on a common surface, as shown in FIG. 1 and, if the first field sensor 20A is rotated with respect to the second field sensor 20B, the first field sensor 20A differs in two orientations (two dimensions or two directions, x, y) from the second field sensor 20B (x', y'), defining different coordinate systems for the first and second field sensors 20A, 20B. Only the vertical z dimension has the same direction. As shown in FIG. 2, the second field sensor 20B is disposed on a surface that is at an incline of approximately 45 degrees with respect to the surface on which the first field sensor 20A is disposed and is rotated 45 degrees with respect to the first field sensor 20A. Thus, as shown in FIG. 2, the first field sensor 20A is also rotated in the z dimension from the second field sensor 20B so that the first field sensor 20A differs in three orientations (three dimensions or directions, x, y, z) from the second field sensor 20B (x', y', z').

The controller 30 can be a discrete or integrated circuit or include both discrete and integrated components. The control circuit 32 can be an analog, digital or mixed-signal circuit. The controller 30 can comprise a stored program machine or state machine. The wires 12 can be any patterned electrical conductor, for example a metal, metal alloy, a conductive metal oxide or a conductive polymer. The device substrate 10 can be any substrate having one or more surfaces on which the first and second field sensors 20A, 20B can be disposed and electrically connected. The controller 30 can also be, but is not necessarily, disposed on a surface of the device substrate 10.

The field-sensor device 99 can be electrically connected to an external system through electrical contact pads 14 formed on the device substrate 10 that are electrically connected through wires 12 to the controller 30. Although FIGS. 1 and 2 illustrate the controller 30 as disposed on the device substrate 10, in other embodiments of the present invention the controller 30 or a portion thereof is provided on a substrate or structure (e.g., a printed circuit board) separate from the device substrate 10. Similarly, the first and second field sensors 20A, 20B can be disposed on different substrates, surfaces or devices.

Figure 3:
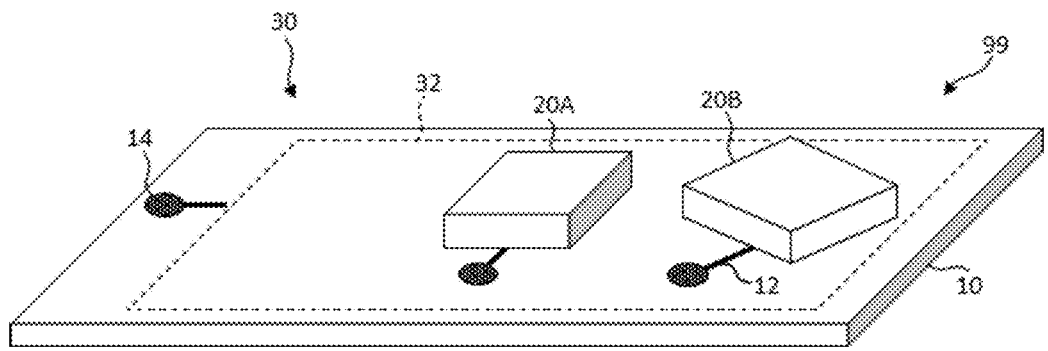
FIG. 3 is a perspective of another illustrative embodiment of the present invention.

Referring to FIG. 3, in some embodiments the device substrate 10 is or comprises a semiconductor substrate comprising at least a portion of the controller 30 and the control circuit 32, or a portion of the control circuit 32, is formed in or on the semiconductor substrate. In another embodiment and as shown in FIGS. 1 and 2, the controller 30 or a portion of the controller 30 is an integrated circuit disposed on the device substrate 10 and the device substrate 10 is a dielectric or has a dielectric layer or surface. Thus, the device substrate 10 can comprise a substrate material that is at least partially different from a material of the first and second field sensors 20A, 20B and is at least partially different from a material of the control circuit 32. In some embodiments the first and second field sensors 20A, 20B comprise compound semiconductors, the controller 30 comprises a silicon semiconductor and the substrate material comprises a dielectric (FIGS. 1 and 2). In another embodiment the first and second field sensors 20A, 20B comprise compound semiconductors and the device substrate 10 material comprises a silicon semiconductor and the control circuit 32 is formed in or as part of the silicon semiconductor (FIG. 3).

Referring to FIG. 4, the device substrate 10 can be mounted on a system substrate 16, for example a system substrate 16 of another device or system. Any one of the device substrate 10, the controller 30, the first field sensor 20A or the second field sensor 20B can be a micro-transfer printed component and comprise a fractured, broken or separated tether. The controller 30, the first field sensor 20A or the second field sensor 20B can be integrated circuits or bare die and can be micro-transfer printed onto the device substrate 10 and the device substrate 10 can be micro-transfer printed onto the system substrate 16.

In embodiments of the present invention the first orientation differs from the second orientation in one dimension, in two dimensions as shown in FIG. 1, or in three dimensions as shown in FIG. 2. In some embodiments the dimensions in each orientation are orthogonal. In other embodiments the dimensions are not orthogonal. For example, FIG. 5A illustrates three orthogonal dimensions (x, y, z) in one orientation or coordinate system, FIG. 5B illustrates three orthogonal dimensions (x', y', z) in another orientation or coordinate system in which the x' and y' dimensions are rotated by 45 degrees with respect to the orientation of FIG. 5A but the z dimension has the same orientation so that the orientation of FIG. 5B differs from the orientation of FIG. 5A in two dimensions.

FIG. 5C illustrates three orthogonal dimensions (x', y', z') in yet another orientation or coordinate system in which the x, y, and z dimensions are all rotated by 45 degrees with respect to FIG. 5A so that the orientation of FIG. 5C differs from the orientation of FIG. 5A in three dimensions. The first and second field sensors 20A, 20B illustrated in FIG. 1 have different first and second orientations corresponding to the different orientations of FIGS. 5A and 5B. The first and second field sensors 20A, 20B illustrated in FIG. 2 have different first and second orientations corresponding to the different orientations of FIGS. 5A and 5C.

Referring to FIG. 6, the control circuit 32 includes a storage circuit 34 for storing any one or more of the first sensor signal, the second sensor signal, any converted or comparable sensor signal, any corrected or adjusted signals, the error signal, the error function, the correction, and a rotation matrix, a conversion circuit 36 for converting the first or second sensor signals to comparable sensor signals, and a comparison circuit 38 for comparing any one or more of the first sensor signal, the second sensor signal, and any comparable sensor signals or pre-determined tolerance, margins, or threshold values. The circuits can be, for example, silicon circuits, either analog circuits or digital circuits, for example CMOS circuits.

Figure 7A:
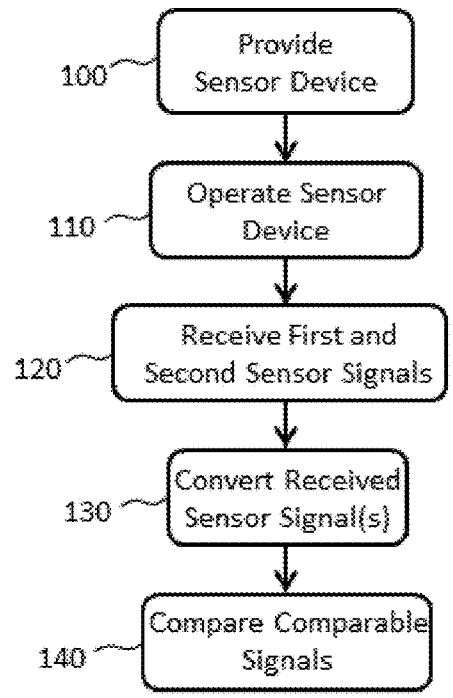
FIGS. 7A, 7B, and 7C are flow charts of methods according to illustrative embodiments of the present invention.

Referring to FIG. 7A, according to embodiments of the present invention a field-sensor diagnostic method comprises providing a field-sensor device 99 in step 100 and providing power to the field-sensor device 99 to operate the field-sensor device 99 in step 110. In step 120 the control circuit 32 is used to receive the respective first and second sensor signals. In step 130 the control circuit 32 is used to convert the received first or second sensor signal, or both, to equivalent comparable sensor signals in a common orientation or coordinate system and compares them in step 140.

Figure 7B:
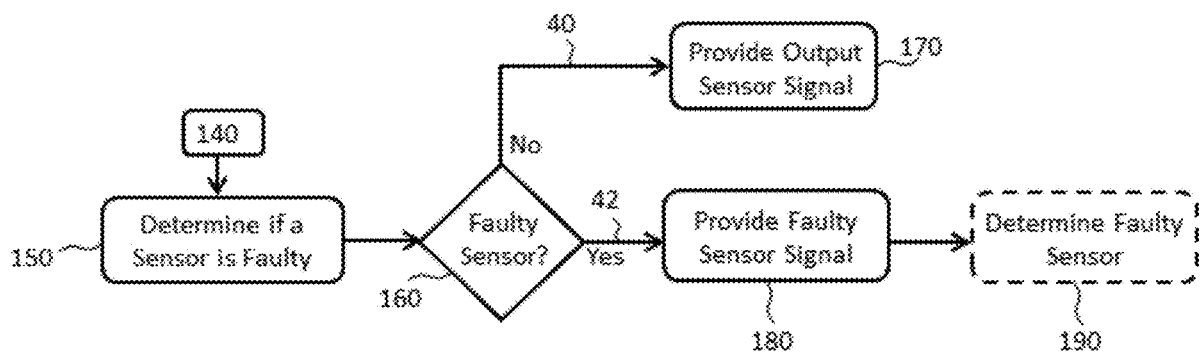

In an embodiment of the present invention illustrated in FIG. 7B, the control circuit 32 then determines in step 150 if either the first field sensor 20A or the second field sensor 20B is faulty. If a field sensor 20 is faulty (tested in step 160), the control circuit 32 is used to provide a faulty sensor signal 42 responsive to the comparable sensor signals (step 180) and, optionally, to determine which of the first and second field sensors 20A, 20B is faulty (step 190). If a field sensor 20 is not faulty (tested in step 160), the control circuit 32 is used to provide an output sensor signal 40 responsive to or derived from the first, second or comparable sensor signals in step 170. In an embodiment the output sensor signal 40 is a combination, for example an average, of the comparable sensor signals or signals derived from the first and second sensor signals, or a corrected or adjusted output sensor signal 40, thus reducing the variability and improving the accuracy and consistency of the output sensor signal 40 (FIGS. 1, 2).

Steps 120 to 150 can be repeatedly performed at different times and the first and second sensor signals stored in the storage circuit 34 and averaged over time or otherwise combined to improve the signal-to-noise ratio of the first and second sensor signals. Alternatively, converted, comparable sensor signals can be stored in the storage circuit 34 and averaged over time or otherwise combined to improve the signal-to-noise ratio of the comparable sensor signals.

In some methods of the present invention, if the second field sensor 20B is faulty, an output sensor signal 40 (FIGS. 1, 2) that is the first sensor signal or is derived from the first sensor signal is provided in step 180, so that the field-sensor device 99 can continue to operate. If the first field sensor 20A is faulty, an output sensor signal 40 (FIGS. 1, 2) that is the second sensor signal or is derived from the second sensor signal is provided in step 180, so that the field-sensor device 99 can continue to operate. Thus, by identifying the failed field sensor 20, the field-sensor device 99 can continue to operate by using sensed signals from other field sensors 20, in contrast to sensor systems that can detect a failure, but cannot continue to operate because no known good field-sensor signal can be identified.

Figure 7C:
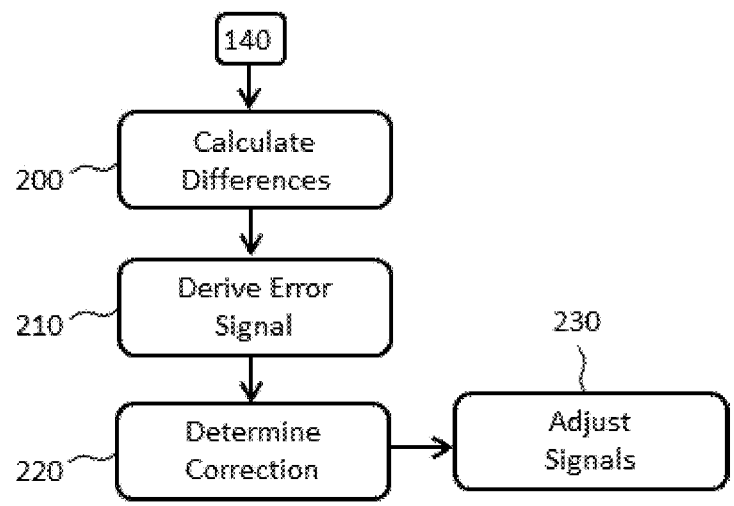

In other methods of the present invention, referring to FIG. 7C, one or more differences between the first and second comparable signals are calculated (step 200) from the compared comparable signals (step 140) and a corresponding error signal is derived from differences between the first and second comparable sensor signals in step 210. An error function can optionally be derived from the error signal, for example a function best fit to the differences of the error signal and a corresponding correction determined (step 220). The correction can be a function and can be used to correct any combination of the first and second sensor signals, thereby adjusting any combination of the first and second sensor responses to reduce the error signal and provide a more accurate response to the measured field (step 230). In various embodiments of the present invention the differences are differences in magnitude, differences in direction, differences in both magnitude and direction in the measured values, or vector differences. A vector can include any combination of a magnitude, a positive or negative direction and an origin.

Figure 8:
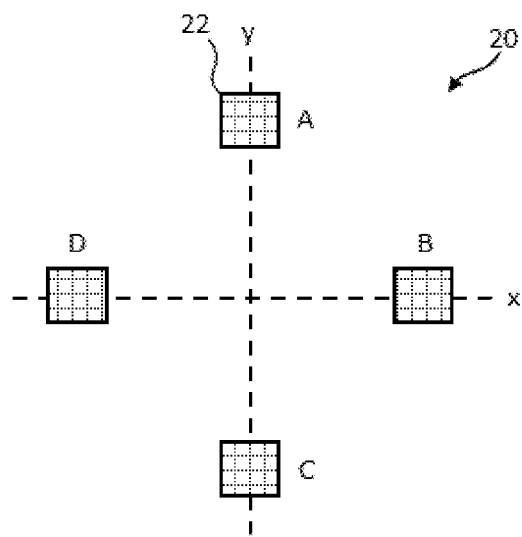
FIG. 8 is a schematic of sensor elements in a coordinate system according to illustrative embodiments of the present invention.

A field sensor 20 can be a sensor element 22 or include a single sensor element 22 or multiple sensor elements 22. Referring to FIG. 8, in embodiments of the present invention the first field sensor 20A or the second field sensor 20B can comprise one or more sensor elements 22 or one or more pairs of sensor elements 22, for example a pair of Hall-effect sensor elements 22. As shown in FIG. 8, the field sensor 20 comprises four sensor elements 22 arranged in two orthogonal pairs (A, C and B, D) to provide measurements in each of the two dimensions corresponding to the directions of the two orthogonal pairs. Each pair of sensor elements 22 in a direction can provide a measurement of the field magnitude in that direction. Thus, in an embodiment of the present invention either of the first or second field sensors 20A, 20B includes two sensor elements 22 arranged to detect the magnitude of a field in a first dimension or direction and two sensor elements 22 arranged to detect the magnitude of a field in a second dimension or direction different from the first dimension or direction. In some embodiments the first and second dimensions are orthogonal dimensions.

Figure 9:
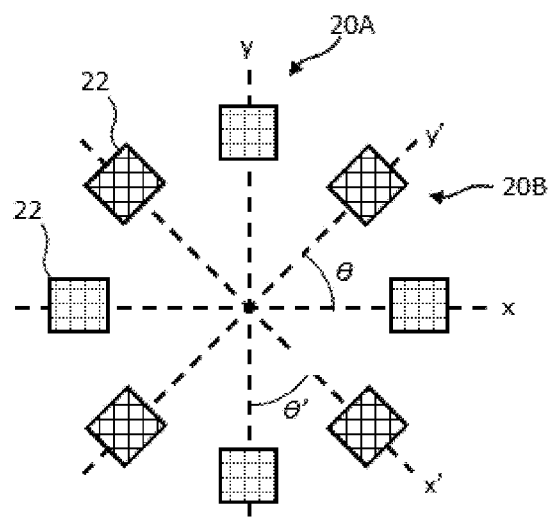
FIG. 9 is a schematic of field sensors with sensor elements in two different coordinate systems according to illustrative embodiments of the present invention.

Referring to FIG. 9, the first and second field sensors 20A, 20B are rotated by 45 degrees and arranged in a common plane so that the first orientation differs from the second orientation in two dimensions, and also correspond to the illustrations of FIGS. 1, 3, 4, 5A and 5B, and 8. In configurations of the present invention correlation between axes of different coordinate systems is maximized at 45 degrees in a Cartesian coordinate system. In other embodiments other coordinate systems, for example cylindrical, polar or spherical coordinate systems are used. In general, a measurement is a projection of an actual field onto the coordinate system. In an embodiment a method of the present invention comprises determining in step 190 (FIG. 7B) which of the two or more field sensors 20 is faulty.

In an embodiment of the present invention the first and second field sensors 20A, 20B are spatially offset from each other, as shown in FIGS. 1-4. In another embodiment of the present invention the first and second field sensors 20A, 20B spatially overlap each other, as shown in FIG. 9. In a further embodiment of the present invention the spatially overlapping first and second field sensors 20A, 20B have a common centre, also as illustrated in FIG. 9. By locating and overlapping the first and second field sensors 20A, 20B at a common location with a common origin, the first and second field sensors 20A, 20B are more likely to measure the identical field. The first and second field sensors 20A, 20B can both be provided in a common structure or device within the field-sensor device 99 of the present invention, e.g., in a single integrated circuit or on a single printed-circuit board.

The field sensors 20 can be magnetic sensors such as Hall-effect sensors, magnetoresistive sensors such as extreme magnetoresistive sensors (XMR) extraordinary magnetoresistive sensors (EMR), giant magnetoresistive sensors GMR, tunnelling magnetoresistive sensors (TMR), colossal magnetoresistive sensors (CMR) or anisotropic magnetoresistive sensors (AMR) or other magnetic sensors.

Any of the elements in the field-sensor device 99 can be analog components, include analog-to-digital convertors or can be digital components. The circuits can include a CPU with a program stored in a memory, a stored program machine, a state machine, hardwired digital logic or a digital or analog control circuit or the like. Similarly, in various embodiments of the present invention each of the first and second field sensors 20A, 20B, and the controller 30 can be implemented in a combination of discrete circuit components or integrated circuits or can be integrated into common circuits or common integrated circuits. In some embodiments the first or second field sensors 20A, 20B or the control circuit 32 share circuit components or packages. A common controller 30 can control both the first and second field sensors 20A, 20B.

The first and second field sensors 20A, 20B, the controller 30 or the control circuit 32 can include electronic circuits, digital logic circuits, analog circuits or mixed-signal circuits, or a combination of circuit types and electronic devices. Portions or all of these circuits can be provided in one or more circuits, in common circuits, in one or more integrated circuits or packages or in common integrated circuits or packages. The various components of the field-sensor device 99 can be, for example, provided in electronic circuits, integrated circuits or discrete electronic devices that are electrically connected with wires 12.

Any one or all of the various components can be disposed on one or more printed circuit boards or on one or more semiconductor substrates, or any one or all of the various components can be integrated as a circuit in or on the semiconductor substrate(s), or some combination of integrated circuits provided on the semiconductor substrate(s) and circuits formed in or on the semiconductor substrate(s).

Any one or all of the various components can be provided in packaged integrated circuits or in bare die that are placed or micro-transfer printed onto the semiconductor substrate(s) or other substrate(s). Wires 12 can be provided using photolithographic methods and materials to connect the various components, integrated circuit dies, or circuits integrated on the semiconductor substrate(s).

Each of the first or second field sensors 20A, 20B can be any of various magnetic sensors such as Hall-effect sensors or magneto-resistive sensors and can be provided, for example, in an integrated circuit, discrete elements or as separate integrated circuit components (such as bare die) mounted on a sensor device substrate 10, such as a glass, ceramic, polymer or semiconductor substrate, for example by using pick-and-place, surface-mount or printing techniques. One or more of the integrated circuit components or elements of the field-sensor device 99 such as the controller 30, can be disposed on the first or second field sensor 20A, 20B as bare die deposited by micro-transfer printing and electrically connected. Alternatively, the first or second field sensors 20A, 20B can be disposed on the controller 30 as bare die deposited by micro-transfer printing and electrically connected. The control circuit 32 can be provided as a photolithographically defined circuit in a semiconductor substrate and the first or second field sensor 20A, 20B can be disposed on the semiconductor substrate as bare die and electrically connected to the control circuit 32 using photolithographic processes and materials.

Figure 10:
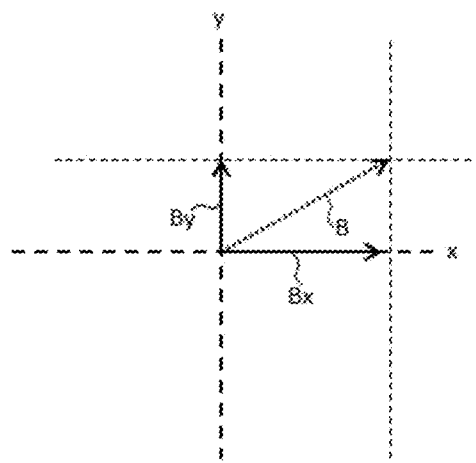
FIGS. 10 and 11 are graphic illustrations of a field vector in two different coordinate systems according to illustrative embodiments of the present invention.
Figure 11:
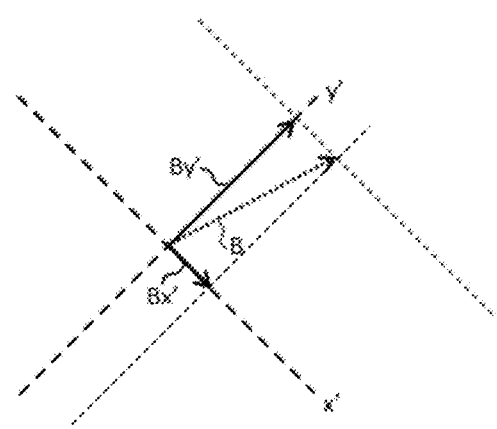

Referring to FIG. 10, an arbitrary and illustrative field vector B is illustrated with respect to the first orientation (first coordinate system) and, referring to FIG. 11, the same field vector B is illustrated with respect to the second orientation (second coordinate system). Since the field vector B is identical in both cases (FIGS. 10 and 11), the first and second sensor signal vectors measured by the first and second field sensors 20A, 20B are equivalent but are not directly comparable (i.e. the magnitude values of the field vectors in each of the measurement axes are different for the first and second orientations). However, since the relative disposition of the first field sensor 20A with respect to the second field sensor 20B, for example at 45 degrees, can be predetermined when the field-sensor device 99 is constructed (disposed on the device substrate 10 surface, FIG. 1), the first sensor signal can be converted (transformed) from the first orientation (first coordinate system) into the second orientation (second coordinate system) and the magnitudes of the field vectors directly compared. Alternatively, the second sensor signal can be converted (transformed) from the second orientation (second coordinate system) into the first orientation (first coordinate system) and the magnitudes and directions of the field vectors directly compared. In yet other embodiments the first sensor signal can be converted into a third orientation (third coordinate system) different from the first and second orientations (first and second coordinate systems) and the second sensor signal can be likewise converted into the third orientation (third coordinate system) so that the magnitudes and directions of the field vectors of the two converted field sensor signals can be directly compared. When the two sensor signals are converted into a common orientation (a common coordinate system), they are comparable signals. This operation can be performed as a matrix transformation with a rotation matrix. Although not required for detecting a sensor fault, in an embodiment in which the faulty sensor is identified, the measurement axes, when projected into another coordinate system, have non-diagonal sub-matrix coefficients in the transformation matrix between axis coordinates where the fault is located.

In the example illustrated in FIG. 9 (corresponding to FIGS. 1, 5A, and 5B), the first and second orientations differ by the angle θ (45°) in the x, y plane parallel to the surface of the device substrate 10 (FIG. 1) and are identical in the z dimension (orthogonal to the common plane on which the first and second field sensors 20A, 20B are disposed), so that the first and second orientations (coordinate systems) in the example of FIG. 9 differ in two dimensions or directions.

A measured field vector in the first coordinate system can have values Bx and By and the same vector measured in the second coordinate system can have values Bx' and By'. Given a known angle θ between two orientations, the x' and y' vectors can be calculated with $x'=x\cos(\theta)+y\sin(\theta)$ and $y'=y\cos(\theta)-x\sin(\theta)$. The reverse calculation is $x=x'\cos(\theta)-y'\sin(\theta)$ and $y=y'\cos(\theta)+x'\sin(\theta)$. Conversion to an arbitrary third orientation can be similarly calculated.

In a simplified example in which θ=45°, as in the example of FIGS. 1 and 9, $\sin(\theta)=\cos(\theta)=1/(2^{1/2})=k\approx0.707$. The simplified equations that convert from the first coordinate system to the second coordinate system are:

$$x'=k(x+y),\ y'=k(y-x),\text{ and}$$

the equations that convert from the second coordinate system to the first coordinate system are:

$$x=k(x'-y'),\ y=k(y'+x').$$

In any physical implementation the first and second field sensors 20A, 20B are not necessarily identical and can have limitations in precision and accuracy and acceptable differences between them within a pre-determined tolerance. Using orientations that differ by 45° degrees in different dimensions provides a greater magnitude difference in the different dimensions, thereby improving the ability to detect faults in each of the different dimensions, although other angles can be used.

Predetermined measurement tolerance margins can be provided to determine whether measurements from the first and second field sensors 20A, 20B are faulty. The predetermined measurement tolerance margins can be specified in each dimension (Bx, By) or as a combination specifying the single net field measurement (Be). If the comparable sensor signals derived by converting the first and second sensor signals into the same coordinate system do not differ by more than the desired tolerance margin, the comparable sensor signals can be combined and provided as the output sensor signal 40. If the comparable sensor signals differ by more than the desired tolerance margin, one of the first or second field sensors 20A, 20B is deemed to be faulty.

Figure 12:
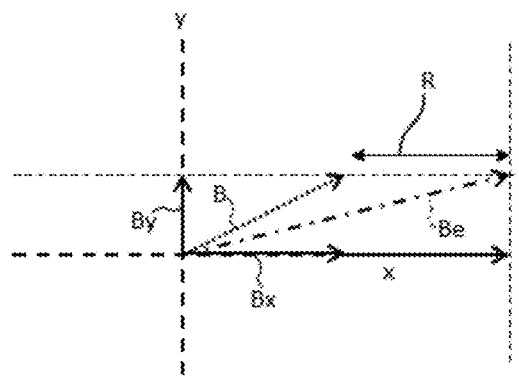
FIG. 12 is a graphic illustration of a field vector having an error in the x-coordinate measurement according to an illustrative embodiment of the present invention.
Figure 13:
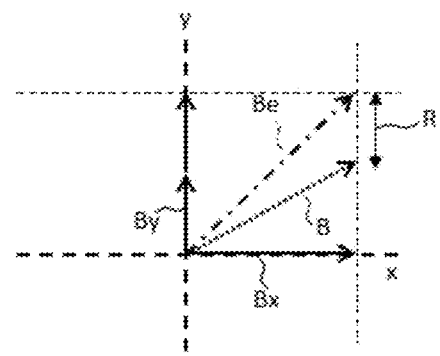
FIG. 13 is a graphic illustration of a field vector having an error in the y coordinate measurement according to an illustrative embodiment of the present invention.

As an illustration, an arbitrary field vector B is illustrated in FIG. 12 having a length in the x dimension that is twice the length in the y dimension where the length represents the field strength in the corresponding dimension. Given a first field sensor 20A in a first orientation and first coordinate system with orthogonal dimensions x, y and a second field sensor 20B in a second orientation and second coordinate system with orthogonal dimensions x', y' rotated by θ=−45 degrees from the first orientation (FIGS. 1 and 9), an error in the x-dimension sensor of the first field sensor 20A results in an erroneous field measurement $B_e$ that differs from the correct field B only in the x dimension in the first coordinate system, illustrated by vector R. Referring to FIG. 13, an error in the y dimension sensor of the first field sensor 20A results in an erroneous field measurement $B_e$ that differs from the correct field B only in the y dimension in the first coordinate system, again illustrated by vector R.

Figure 14A:
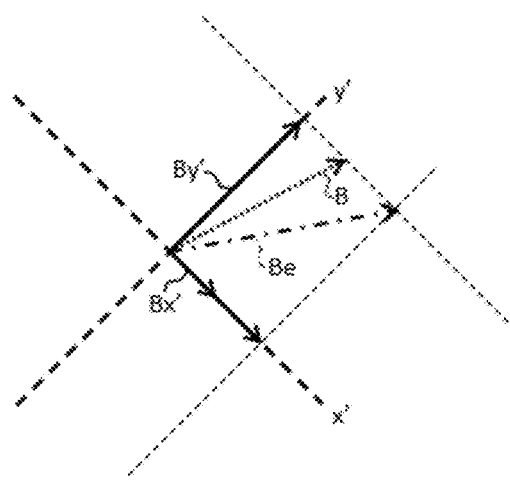
FIG. 14A is a graphic illustration of a field vector having an error in the rotated x' coordinate measurement and FIG. 14B is a graphic illustration of the measured field vector of FIG. 14A in the x, y coordinate system according to an illustrative embodiment of the present invention.
Figure 14B:
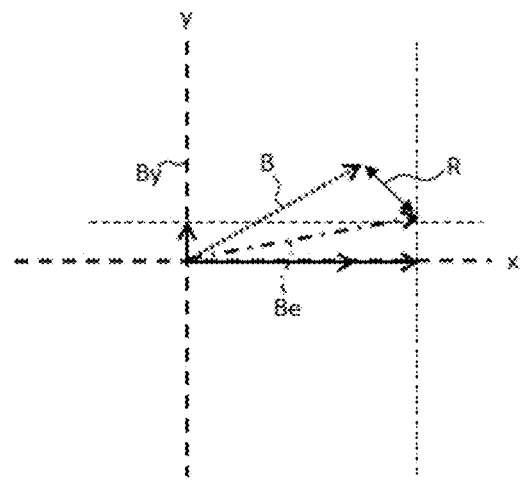
Figure 15A:
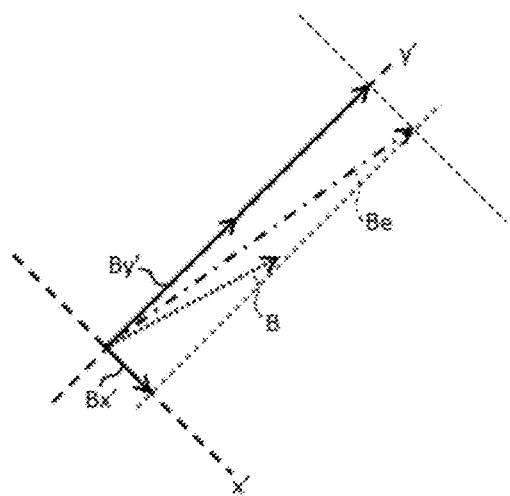
FIG. 15A is a graphic illustration of a field vector having an error in the rotated y' coordinate measurement and FIG. 15B is a graphic illustration of the measured field vector of FIG. 15A in the x, y coordinate system according to an illustrative embodiment of the present invention.
Figure 15B:
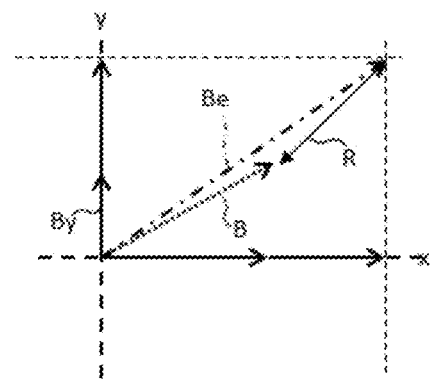

Referring to FIG. 14A, an error in the x' dimension sensor of the second field sensor 20B results in an erroneous field measurement $B_e$ that differs from the correct field B only in the x' dimension in the second coordinate system. When converted into the first coordinate system (FIG. 14B), the erroneous field measurement $B_e$ differs from the correct field B by a direction in the first coordinate system corresponding to the direction of the x' dimension in the second coordinate system (shown with the solid light arrow in FIG. 14B and labelled vector R). Referring to FIG. 15A, an error in the y' dimension sensor of the second field sensor 20B results in an erroneous field measurement $B_e$ that differs from the correct field B only in the y' dimension in the second coordinate system. When converted into the first coordinate system (FIG. 15B), the erroneous field measurement $B_e$ differs from the correct field B by a direction in the first coordinate system corresponding to the direction of the y' dimension in the second coordinate system (shown with the solid light arrow in FIG. 15B, illustrated by vector R).

In all of the examples of FIGS. 12, 13, 14A, 14B, 15A, 15B, the angular difference between the first and second coordinate system is θ=−45 degrees (as shown in FIGS. 14A, 15A) and the error is a doubling of the sensor response in the respective dimension, indicated by the two co-linear arrows in the illustrations.

Therefore, given a difference in angle between the first and second coordinate systems of θ, an error vector E=Be−B, if E≠0 and the angle of the vector E in the first coordinate system equals:

0 degrees, the error is in the x-dimension sensor of the first field sensor 20A;

90 degrees, the error is in the y-dimension sensor of the first field sensor 20A;

θ degrees, the error is in the x'-dimension sensor of the second field sensor 20B (−45 degrees in the example of FIGS. 14A and 14B); and −θ degrees, the error is in the y'-dimension sensor of the second field sensor 20B (45 degrees in the example of FIGS. 15A and 15B).

In general, the direction of the error vector corresponds to the dimension measured by the faulty field sensor 20, so long as a fault is present only in a single field sensor dimension measurement. In other words, the error vector R has a unique component in the direction of the axis (direction) of the measured faulty sensor element 22. The error vector R can be expressed as a multiple of the unit vector of the axis (direction) of the faulty sensor measurement. Thus, the control circuit 32 can comprise circuitry that compares the direction of differences between the comparable sensor signals (e.g., Bx, By, Bx', By') to determine a faulty field sensor 20.

As described above, in some embodiments of the present invention differences between the comparable signals are used to identify faulty field sensors 20 or sensor elements 22. In other embodiments of the present invention differences between the comparable sensor signals can be used to correct measured sensor signals or to reduce errors in the sensor signal measurements by calculating a correction derived from the comparable sensor signal differences and using the calculated correction to adjust the measurements.

In general, field sensors 20 have a sensitivity to a field that the field sensor 20 detects and measures. Since manufacturing processes are never perfect and materials are never identical, manufactured field sensors 20 have different responses to the field. Furthermore, the response of a field sensor 20 can vary over time, various different environments and in use. Thus, a field-sensor device 99 with redundant field sensors 20 produces different measured values depending on the sensitivity of the field sensors 20. In one configuration the different measurements are simply averaged to reduce the variability of the measurements.

In some embodiments field sensors 20 have a linear response to a field, for example with an electrical sensor signal. If the field sensor 20 drifts, the sensitivity of the field sensor 20 can change and, moreover, the DC offset of the electrical signal can be non-zero. Thus, the drifting field sensor 20 will measure a non-zero field, even when no field exists, and can be more or less sensitive to the field when it is present. For such a field sensor 20 the electrical sensor response can be a voltage that is dependent on the field by V=F*S+O, or the field sensor 20 response is a voltage equal to the field (F) times a sensitivity value (S) plus an offset value (O). For ideal field sensors 20 the offset value O is zero and the sensitivity value is fixed and identical for all of the field sensors 20.

However, according to embodiments of the present invention both the sensitivity value S and the offset value O of a field sensor 20 can change over time or subject to different circumstances or usage. The measured voltage signal from the field sensor 20 can be corrected by adjusting the sensitivity S, for example by multiplying it by a correction value and adding (or subtracting) an offset value. The corrections can be estimated by comparing the signals from different field sensors 20 provided in different orientations and, as the field sensor 20 responses change, the correction estimation can likewise change.

In a method of the present invention and with reference to FIGS. 7A and 7C and their description above, a first field sensor 20A with a first sensor response to a field is provided, the first sensor response measured in a first orientation to produce a first sensor signal, and a second field sensor 20B with a second sensor response to the field is provided, the second sensor response measured in a second orientation to produce a second sensor signal. The first and second orientations are different. A controller 30 comprises a control circuit 32 for controlling the first and second field sensors 20A, 20B to produce respective first and second sensor signals.

The controller 30 operates the first and second field sensors 20A, 20B to sense the field and produce respective first and second sensor signals subject to the corresponding first and second sensor responses. The first and second sensor signals are converted to equivalent first and second comparable signals in a common orientation (coordinate system), for example as illustrated in FIGS. 14A and 14B, and discussed with respect to FIG. 7A above. An error signal is derived from differences between the first and second comparable sensor signals and any combination of the first and second sensor responses is adjusted to reduce the error signal. By adjusting a sensor response, the measured sensor signal is also adjusted and can be reported as a corrected field measurement with reduced error.

Figure 16A:
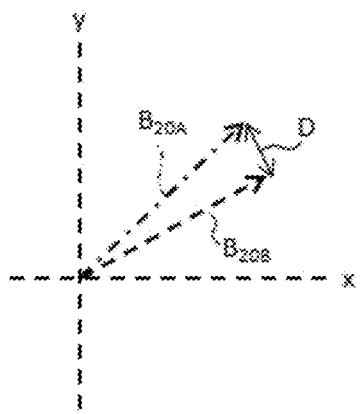
FIGS. 16A and 16B are graphs illustrating comparable signal vectors and a difference vector according to embodiments of the present invention.
Figure 16B:
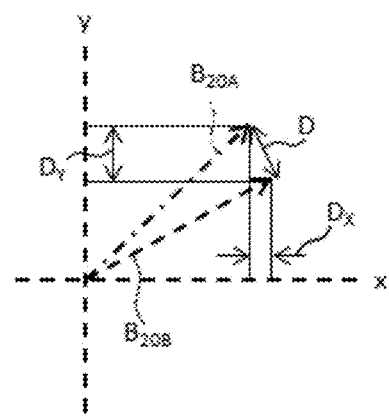

Referring to FIG. 16A, the measured response of a first field sensor 20A and a second field sensor 20B are shown in a common orientation. Because the first and second field sensors 20A, 20B are not identical, their response to the field is different, shown by the two different vectors illustrated. The differences in the responses of the two field sensors 20 is shown by the difference vector D. Referring to FIG. 16B, the difference vector D is projected onto the x axis and y axis as values $D_x$ and $D_y$, respectively. In general, the differences can be differences in magnitude, differences in direction, differences in both magnitude and direction, a difference in origin or generally a vector difference.

Figures 17, 18:
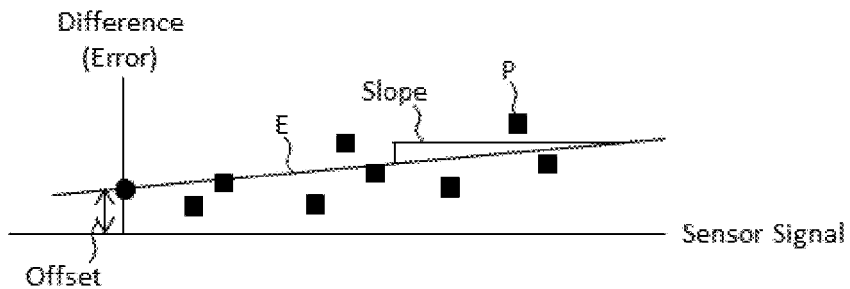
FIG. 17 is a graph illustrating differences and an error function according to embodiments of the present invention.
FIG. 18 is a tabular illustration of examples according to embodiments of the present invention.

Referring to FIG. 17, differences (P) between the first and second comparable signals form a discrete error signal that can be determined as an error function E of the error signal in the y dimension and in the x dimension with respect to any other combination of the first and second comparable sensor signals, any combination of components or constituents of the first and second comparable sensor signals (e.g., magnitude in a coordinate system direction, absolute magnitude, direction), or, when the first and second field sensors comprise two or more sensor elements producing sensor element signals, any combination of sensor element signals, such as a voltage indicating a sensor element signal magnitude. As shown in FIG. 17, the differences are plotted on the y axis as a function of the magnitude of a sensor signal. Each point plotted represents a difference between two comparable signals, for example measured as a field strength magnitude. The collection of points representing the difference P forms an error signal, in this case a non-continuous discrete set of multiple points, for example as could be documented in a table. An error function E can estimate the error signal for all x values, for example by fitting a function, such as a least-squares function, to the error signal P. If the field sensors 20 were ideal, the error function E would be the x axis. If the error function E has a non-zero slope but passes through the origin, no relative (net) offset is present. If the error function E does not pass through the origin, the comparable signals (and the error function E) have a relative offset. If the error function is not flat (has a non-zero slope), the field sensors 20 and comparable signals have different sensitivities (responses to the field). Thus, depending on the field sensor 20 signal differences, a correction (adjustment) to the signal could be the subtraction of a constant value, such as an offset value, or the multiplication of one signal or another (or both) by a constant value. Thus, in embodiments the correction can be a constant value. In other embodiments the correction is a linear function having a slope and an offset and the correction is a linear function as described above.

FIG. 18 provides three illustrative examples A, B, and C. In these examples the first and second field sensors 20A, 20B each measure a changing field at two different times 1 and 2, producing signals $M_{A1}$ (first field sensor 20A measurement time 1), $M_{B1}$ (second field sensor 20B measurement time 1), $M_{A2}$ (first field sensor 20A measurement time 2), $M_{B2}$ (second field sensor 20B measurement time 2). The first and second field sensors 20A, 20B are arranged at 45 degrees in a common plane and one of the field measurements is converted into the coordinate system (orientation) of the other, or both are converted into a different common coordinate system. Since the field sensors 20 measure fields, the measurement is a vector represented by two values.

In Example A the first field sensor 20A measures a first field vector value at time 1 of (4,4) and the second field sensor 20B measures the same first field at the same time 1 in a common coordinate system as (6,6). Similarly, the first field sensor 20A measures a second field vector value at time 2 of (2,2) and the second field sensor 20B measures the same second field at the same time 2 in a common coordinate system as (3,3). Thus, two points P are provided for the error signal and an error function estimating the error signal can be $f(x)=1.5x_A$ and $f(y)=1.5y_A$. Other functional representations are possible, for example as a function of field sensor 20B measurements or functions for each of the first and second field sensor 20A, 20B measurements. An interpretation of the example is that the second field sensor 20B is 1.5 times more sensitive than the first field sensor 20A or, alternatively, that the first field sensor 20A is one third less sensitive than the second field sensor 20B. A correction can be to multiply the first field sensor 20A measurements by 1.5 or the second field sensor 20B measurements by ⅔. Alternatively, both field sensors 20 can be multiplied by a value derived from the error function E slope of 1.5. Over time, the measurement signals can vary and the correction can vary as well, thereby reducing the signal error and enabling the benefit of redundant sensors. For example, if one field sensor 20 should fail completely, the other field sensor 20 can continue to provide corrected measurement signals with improved accuracy and reduced errors.

Field sensors 20 can have two sensor elements 22 that each have different sensitivities and changes over time. Referring to Example B, the response of the y sensor element 22 for the second field sensor 20B is twice that of the first field sensor 20A and the x sensor element 22 response is the same as in Example A. In this case the correction for y is different from that of x. The correction for the x value is 1.5 or a related value but the correction for y is 2.0 or a related value.

Referring to Example C, the differences between the first and second field sensor 20A, 20B sensitivities are the same as those for Example B, except that a signal response is present even when no field is present, implying that one or the other, or both, of the field sensors 20 has an offset. In this case one can presume that a zero should be measured when no field is present. A correction is shown for the second field sensor 20B rather than the first (as in Examples A and B).

The examples of FIG. 18 are chosen to simply illustrate various differences between comparable signals from different field sensors 20. Those knowledgeable in the art will appreciate that in some embodiments with many more sampled measurement differences an exact correction cannot be found and estimates are used. Further, corrections to both the field sensor 20 measurements can be used to reduce the overall error.

The measurement difference can be weighted by time so that recent differences in the comparable signals carry more weight in the calculation of a correction. Thus, as the responses of the field sensors 20 vary over time, the correction can change to accommodate the sensor variation.

The field sensors 20 can be initially individually calibrated with a known field and any sensitivity or offset adjustments established before the field sensors 20 are put into service. Such a calibration will provide confidence in the field sensors' 20 initial accuracy and can provide a baseline against which subsequent changes are made.

In a further embodiment of the present invention a third field sensor 20C (FIG. 19) with a third sensor response to the field, is provided. The third sensor response is measured in a third orientation to produce a third sensor signal. The controller 30 can comprise another control circuit 33 for controlling the third field sensor 20C to produce third sensor signals. The other control circuit 33 in the controller 30 can be used to convert third sensor signals to equivalent third comparable sensor signals in the common orientation if the third orientation is different from the common orientation. If the third orientation is the same as the common orientation, the other control circuit 33 can use the third comparable sensor signals as comparable sensor signals without conversion. The other control circuit 33 can calculate an error signal derived from differences between the third comparable sensor signals and any combination of the first and second comparable sensor signals. Any combination of the first, second and third sensor responses can be adjusted to reduce the error signal. As with the differences between the first and second comparable signals, the differences with the third comparable signals can be differences in magnitude, differences in direction, differences in both magnitude and direction or a vector difference.

In embodiments of the present invention the step of calculating the error signal comprises calculating the differences between the third comparable sensor signals and any combination of the first and second comparable sensor signals as an error function of any other combination of the first, second and third comparable sensor signals, any combination of components or constituents of the first and second comparable sensor signals (e.g., magnitude in a coordinate system direction, absolute magnitude, direction), or, when the first and second field sensors comprise two or more sensor elements producing sensor element signals, any combination of sensor element signals, such as a voltage indicating a sensor element signal magnitude. A correction corresponding to or derived from the error function can be determined.

In some embodiments of the present invention the correction is a constant or is a linear function having a slope and an offset. The step of adjusting any combination of the first, second and third sensor responses can comprise multiplying the constant times any combination of the first, second and third sensor signals or adding the constant to any combination of the first, second and third sensor signals. Alternatively, the step of adjusting any combination of the first, second and third sensor responses can comprise multiplying a value derived from the slope to any combination of the first, second and third sensor responses, adding a value derived from the offset to any combination of the first, second and third sensor responses, both, or adding a value derived from the offset to a product of a value derived from the slope and any combination of the first, second and third sensor responses.

The correction can be calculated to reduce the error in any one of the first, the second and the third field sensor 20C measurements, or any combination of the first, the second and the third field sensor 20C measurements. For example, the correction can reduce the differences between the first and third sensor signals, the second and third sensor signals, the first and second sensor signals or all of the first, second and third sensor signals in a comparable coordinate system. Thus, a multi-variate, multi-dimensional error function and correction can be estimated that is derived from differences between any of the first, second and third comparable sensor signals and can be used to adjust any combination of the first, second and third sensor responses and the corresponding first, second and third sensor signals or any combination of first, second and third sensor signals reported as a corrected field measurement with reduced error. Thus, in an embodiment of the present invention, an output sensor signal 40 responsive to any combination of the first, second or third (if present) sensor signals is provided and adjusted first, second or third (if present) responses.

In embodiments of the present invention the third orientation is different from the first orientation and different from the second orientation, the third orientation is the same as the first orientation or the third orientation is the same as the second orientation. Thus, the third field sensor 20C can be disposed with the same orientation as the first field sensor 20A, with the same orientation as the second field sensor 20B or with an orientation different from both the first field sensor 20A and the second field sensor 20B. In some embodiments the first and second orientations are in a common plane and the first orientation is not orthogonal to the second orientation. In such an embodiment the first orientation can be 45 degrees rotated from the second orientation.

According to embodiments of the present invention a field-sensor device 99 implementing the methods described can comprise a first field sensor 20A with a first sensor response to a field, the first sensor response measured in a first orientation to produce a first sensor signal, a second field sensor 20B with a second sensor response to the field the second sensor response measured in a second orientation different from the first orientation to produce a second sensor signal, and a controller 30 for controlling the first and second field sensors 20A, 20B to produce respective first and second sensor signals. The controller 30 comprises a control circuit 32 that converts any combination of first and second sensor signals to equivalent first and second comparable sensor signals in a common orientation, calculates an error signal derived from differences between the first and second comparable sensor signals, and adjusts any combination of the first and second sensor responses to reduce the error signal.

In some embodiments the controller 30 comprises a control circuit 32 that calculates the differences between the first and second comparable sensor signals as an error function of any other combination of the first and second comparable sensor signals, any combination of components or constituents of the first and second comparable sensor signals (e.g., magnitude in a coordinate system direction, absolute magnitude, direction), or, when the first and second field sensors comprise two or more sensor elements producing sensor element signals, any combination of sensor element signals, such as a voltage indicating a sensor element signal magnitude. The correction can be a constant or a linear function having a slope and an offset.

In some embodiments of the present invention the controller 30 comprises a control circuit 32 that adjusts any combination of the first and second sensor responses by multiplying the constant times any combination of the first and second sensor signals or by adding the constant to any combination of the first and second sensor signals. In some embodiments the controller 30 comprises a control circuit 32 that adjusts any combination of the first and second sensor responses by multiplying a value derived from the slope to any combination of the first and second sensor responses, adding a value derived from the slope to any combination of the first and second sensor responses, both, or adding a value derived from the offset to a product of a value derived from the slope and any combination of the first and second sensor responses.

Figure 19:
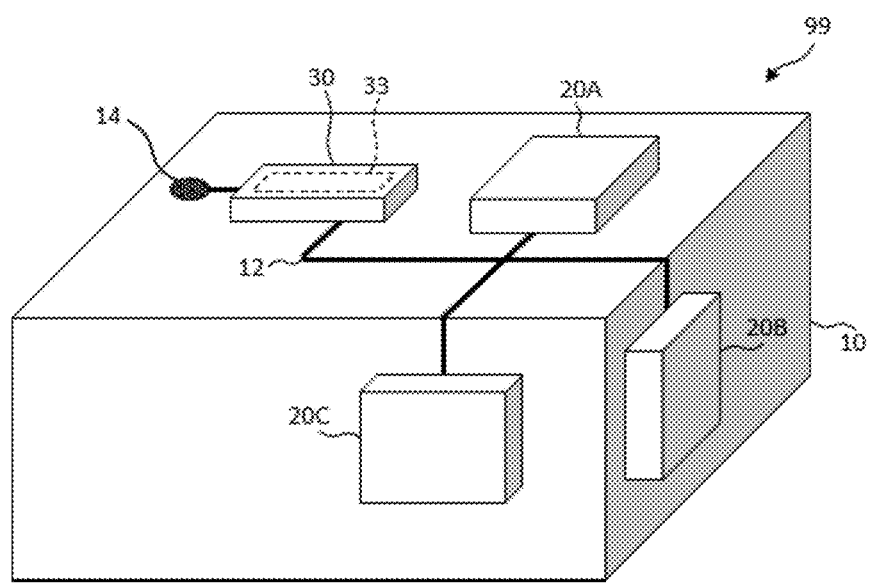
FIG. 19 is a perspective of an embodiment of the present invention having three field sensors.

In an embodiment of the present invention and referring to FIG. 19, a field-sensor device 99, comprises a third field sensor 20C with a third sensor response to the field in addition to the first and second field sensors 20A, 20B. The third sensor response is measured in a third orientation to produce a third sensor signal, and another control circuit 33 disposed in the controller 30 for controlling the third field sensor 20C to produce the third sensor signal. The other control circuit 33 converts third sensor signals to equivalent third comparable sensor signals in the common orientation if the third orientation is different from the common orientation. If the third orientation is the same as the common orientation, the third sensor signals are third comparable sensor signals. The other control circuit 33 calculates an error signal derived from differences between the third comparable sensor signals and any combination of the first and second comparable sensor signals and adjusts any combination of the first, second and third sensor responses to reduce the error signal. The differences can be differences in magnitude, differences in direction, differences in both magnitude and direction or a vector difference.

In embodiments of the present invention the controller 30 comprises a control circuit (e.g., other control circuit 33) that calculates the differences between the third comparable sensor signals and any combination of the first and second comparable sensor signals as an error function of any other combination of the first, second and third comparable sensor signals, any combination of components or constituents of the first and second comparable sensor signals (e.g., magnitude in a coordinate system direction, absolute magnitude, direction), or, when the first and second field sensors comprise two or more sensor elements producing sensor element signals, any combination of sensor element signals, such as a voltage indicating a sensor element signal magnitude.

In some embodiments of the present invention the correction is a constant or is a linear function having a slope and an offset. The controller 30 can comprise a control circuit (e.g., other control circuit 33) that adjusts any combination of the first, second and third sensor responses by multiplying the constant times any combination of the first, second and third sensor signals or adding the constant to any combination of the first, second and third sensor signals. In other embodiments the controller 30 comprises a control circuit (e.g., other control circuit 33) that adjusts any combination of the first second and third sensor responses by multiplying a value derived from the slope to any combination of the first, second and third responses, adding a value derived from the slope to any combination of the first, second and third responses, or adding a value derived from the offset to a product of a value derived from the slope and any combination of the first, second and third sensor responses.

In embodiments of the present invention the third orientation is different from the first orientation and different from the second orientation, the third orientation is the same as the first orientation, or the third orientation is the same as the second orientation. In some embodiments and as illustrated in FIG. 19, the third orientation is different from the first orientation and different from the second orientation and is oriented orthogonally to both the first and second orientations.

As intended herein, any combination of two items A and B can comprise only A, can comprise only B or can comprise A and B. Any combination of three items A, B, and C can comprise only A, can comprise only B, can comprise only C, can comprise A and B, can comprise A and C, can comprise B and C or can comprise A, B, and C. The use of the word 'both' in a list includes both of the two previous elements of the list.

According to embodiments of the present invention, the field-sensor device 99 functions to measure fields at the same time as the first and second field sensors 20A, 20B are monitored and diagnosed and, if a fault is detected, to provide real-time diagnostic signals corresponding to any or both of the first and second field sensor 20A, 20B. Alternatively, differences in the first and second field sensor 20A, 20B measurements are determined and corrected to provide an adjusted output sensor signal with reduced error.

Embodiments of the present invention can be constructed by providing a substrate and mounting the first or second field sensor 20A, 20B and controller 30 as integrated circuits on the substrate. The integrated circuits can be disposed on the substrate surface using pick-and-place technologies or by micro-transfer printing them from corresponding source wafers onto the substrate surface. Alternatively, the substrate surface can be or include a semiconductor layer and one or more or any portion of each of the first or second field sensor 20A, 20B and controller 30 are formed in the semiconductor layer and electrically connected with any integrated circuits disposed on the substrate surface using wires 12 on the substrate surface, for example by using photolithographic or printed circuit board methods and materials. Alternatively, the control circuits 32 or field sensors 20 can be photolithographically defined in a semiconductor substrate.

The substrate can be one of many substrates with one or more surfaces capable of supporting or receiving the first or second field sensor 20A, 20B and controller 30, for example a glass, plastic, ceramic, or semiconductor substrate with two opposing relatively planar and parallel sides. The substrate can have a variety of thicknesses, for example from 10 microns to several millimeters. The substrate can be a portion or surface of another device and can include electronic circuitry.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A field sensor device comprising
- a first field sensor arranged to measure along one or more measurement axes in a first coordinate system a first sensor signal in response to a field and to output the first sensor signal,
- a second field sensor arranged to measure along one or more measurement axes in a second coordinate system different from said first coordinate system a second sensor signal in response to said field and to output the second sensor signal,
- a controller arranged for operating said first and second field sensors to produce said respective first and second sensor signals, said controller comprising a control circuit arranged for
  - (i) converting any combination of first and second sensor signals to equivalent first and second comparable sensor signals in a common coordinate system and calculating an error signal derived from differences between said first and second comparable sensor signals; and
  - (ii) adjusting any combination of said first and second sensor signals to reduce said error signal.

2. The field sensor device as in claim 1, wherein said differences between said first and second comparable sensor signals are differences in magnitude, differences in direction, differences in both magnitude and direction or a vector difference.

3. The field sensor device as in claim 1, wherein said control circuit is arranged for
   (a) calculating said differences between said first and second comparable sensor signals as an error function of any other combination of said first and second comparable sensor signals, any combination of components or constituents of said first and second comparable sensor signals, or, when said first and second field sensors comprise two or more sensor elements producing sensor element signals, any combination of sensor element signals; and
   (b) determining a correction to said error function.

4. The field sensor device as in claim 3, wherein said correction is a constant and said control circuit is arranged for adjusting a combination of said first and second sensor signals by multiplying a combination of said first and second sensor signals with said constant or by adding said constant to a combination of said first and second sensor signals.

5. The field sensor device as in claim 3, wherein said correction is a linear function having a slope and an offset and said control circuit is arranged for adjusting a combination of said first and second sensor signals by:
   (a) multiplying a value derived from said slope to a combination of said first and second sensor signals;
   (b) adding a value derived from said slope to a combination of said first and second sensor signals;
   (c) both (a) and (b); or
   (d) adding a value derived from said offset to a product of a value derived from said slope and a combination of said first and second sensor signals.

6. The field sensor device as in claim 1, comprising a third field sensor arranged to measure along one or more measurement axes in a third coordinate system a third sensor signal to said field and to output the third sensor signal, and a further control circuit disposed in said controller for controlling said third field sensor to produce said third sensor signal, said further control signal arranged for:
   (i) converting third sensor signals to equivalent third comparable sensor signals in the common coordinate system if said third coordinate system is different from the common coordinate system and if not said third sensor signals are third comparable sensor signals, calculating an error signal derived from differences between said third comparable sensor signals and a combination of said first and second comparable sensor signals; and
   (ii) adjusting a combination of said first, second and third sensor signals to reduce said error signal.

7. The field sensor device as in claim 6, wherein said further control circuit is arranged for
   (a) calculating said differences between said third comparable sensor signals and a combination of said first and second comparable sensor signals as an error function of another combination of said first, second and third comparable sensor signals, a combination of components or constituents of said first, second or third comparable sensor signals, or, when said first, second and third field sensors comprise two or more sensor elements producing sensor element signals, a combination of sensor element signals, and
   (b) determining a correction corresponding to said error function.

8. The field-sensor device as in claim 6, wherein:
   (a) said third coordinate system is different from said first coordinate system and different from said second coordinate system, or
   (b) said third coordinate system is the same as said first coordinate system, or
   (c) said third coordinate system is the same as said second coordinate system.

9. The field sensor device as in claim 8, wherein said third coordinate system is different from said first coordinate system and different from said second coordinate system and is oriented orthogonally to both said first and second coordinate system.

10. The field sensor device as in claim 1, wherein said first and second field sensors each comprise two sensor elements arranged to measure in substantially orthogonal directions for measuring both a magnitude and a direction of said field to produce a field vector.

11. The field sensor device as in claim 1, wherein said first and second coordinate system are in a common plane and:
    (a) said first coordinate system is 45 degrees rotated from said second coordinate system,
    (b) said first coordinate system is not orthogonal to said second coordinate system; or
    (c) both (a) and (b).

12. The field sensor device as in claim 1, configured to output a signal which is a combination of the first and second sensor signals.

13. The field sensor device as in claim 1, wherein said first coordinate system differs from said second coordinate system in two dimensions or in three dimensions.

14. The field sensor device as in claim 1, wherein said control circuit includes a storage circuit for storing one or more of said first sensor signal, said second sensor signal, said first comparable sensor signal or said second comparable sensor signal.

15. The field sensor device as in claim 1, wherein said first and second field sensors are disposed on a device substrate comprising a substrate material and wherein said first and second field sensors comprise one or more sensor materials at least partially different from said substrate material.

16. A method of operating a field sensor device comprising
    measuring along one or more measurement axes in a first coordinate system with a first field sensor a first sensor signal in response to a field and producing a first sensor signal,
    measuring along one or more measurement axes in a second coordinate system different from said first coordinate system with a second field sensor a second sensor signal in response to a field and producing a second sensor signal,
    operating said first and second field sensors to produce said respective first and second sensor signals with a controller comprising a control circuit,
    using said controller for
    (i) converting a combination of said first and second sensor signals to equivalent first and second comparable sensor signals in a common coordinate system, and calculating an error signal derived from differences between said first and second comparable sensor signals; and
    (ii) for adjusting any combination of the first and second sensor signals to reduce the error signal.

* * * * *